United States Patent
Miyairi et al.

(10) Patent No.: US 9,525,023 B2
(45) Date of Patent: Dec. 20, 2016

(54) SEMICONDUCTOR DEVICE

(75) Inventors: Hidekazu Miyairi, Atsugi (JP); Koji Dairiki, Atsugi (JP); Yasuhiro Jinbo, Atsugi (JP); Tomohiro Kimura, Osaka (JP); Yoshitaka Yamamoto, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 282 days.

(21) Appl. No.: 13/473,643

(22) Filed: May 17, 2012

(65) Prior Publication Data

US 2012/0298997 A1    Nov. 29, 2012

(30) Foreign Application Priority Data

May 24, 2011   (JP) .................. 2011-116172

(51) Int. Cl.
*H01L 29/10*   (2006.01)
*H01L 29/04*   (2006.01)
*H01L 29/417*   (2006.01)
*H01L 29/786*   (2006.01)

(52) U.S. Cl.
CPC ......... *H01L 29/04* (2013.01); *H01L 29/41733* (2013.01); *H01L 29/78618* (2013.01); *H01L 29/78672* (2013.01); *H01L 29/78678* (2013.01); *H01L 29/78696* (2013.01)

(58) Field of Classification Search
CPC ............... H01L 29/41733; H01L 29/78618; H01L 29/78672; H01L 29/78696
USPC .......... 257/57, 66, 368, E29.117, E29.121, 257/E29.273
See application file for complete search history.

(56) References Cited

U.S. PATENT DOCUMENTS

| | | | |
|---|---|---|---|
| 4,409,134 A | 10/1983 | Yamazaki | |
| 5,155,564 A | 10/1992 | Hishida et al. | |
| 5,981,972 A * | 11/1999 | Kawai | G02F 1/136227 257/347 |
| 6,153,893 A | 11/2000 | Inoue et al. | |
| 6,468,839 B2 | 10/2002 | Inoue et al. | |
| 7,551,655 B2 | 6/2009 | Tanaka et al. | |

(Continued)

FOREIGN PATENT DOCUMENTS

| | | |
|---|---|---|
| EP | 0349255 A | 1/1990 |
| EP | 0 535 979 | 4/1993 |

(Continued)

*Primary Examiner* — Jamie C Niesz
(74) *Attorney, Agent, or Firm* — Eric J. Robinson; Robinson Intellectual Property Law Office, P.C.

(57) ABSTRACT

One embodiment of the present invention is a semiconductor device which includes a gate electrode; a gate insulating film formed to cover the gate electrode; a semiconductor layer formed over the gate insulating film and placed above the gate electrode; a second insulating film formed over the semiconductor layer; a first insulating film formed over a top surface and a side surface of the second insulating film, a side surface of the semiconductor layer, and the gate insulating film; silicon layers and which are formed over the first insulating film and electrically connected to the semiconductor layer; and a source electrode and a drain electrode which are formed over the silicon layers. The source electrode and the drain electrode are electrically separated from each other over the first insulating film. The semiconductor layer is not in contact with each of the source electrode and the drain electrode.

5 Claims, 6 Drawing Sheets

(56) References Cited

U.S. PATENT DOCUMENTS

| | | |
|---|---|---|
| 7,638,371 B2 | 12/2009 | Chen et al. |
| 8,003,989 B2 | 8/2011 | Nakajima et al. |
| 8,023,055 B2 | 9/2011 | Nakajima et al. |
| 8,187,956 B2 | 5/2012 | Jinbo et al. |
| 8,304,779 B2 | 11/2012 | Yamazaki et al. |
| 8,383,520 B2 | 2/2013 | Marrs |
| 8,481,859 B2 | 7/2013 | Haq et al. |
| 2003/0146439 A1* | 8/2003 | Yamazaki ........... H01L 27/3246 257/79 |
| 2009/0033818 A1 | 2/2009 | Nakajima et al. |
| 2009/0090915 A1* | 4/2009 | Yamazaki ............. H01L 29/04 257/66 |
| 2011/0227203 A1 | 9/2011 | Marrs et al. |
| 2012/0061672 A1* | 3/2012 | O'Rourke ........... H01L 21/6835 257/57 |
| 2012/0262642 A1* | 10/2012 | Ikeda ................. H01L 27/124 349/46 |
| 2013/0271930 A1 | 10/2013 | Haq et al. |
| 2014/0008651 A1 | 1/2014 | Marrs |
| 2014/0254113 A1 | 9/2014 | Howard et al. |

FOREIGN PATENT DOCUMENTS

| | | | | |
|---|---|---|---|---|
| EP | 0 652 595 | 5/1995 | | |
| EP | 1 537 938 | 6/2005 | | |
| JP | 02-013928 A | 1/1990 | | |
| JP | 05-129608 | 5/1993 | | |
| JP | 07-131030 | 5/1995 | | |
| JP | 11-040813 | 2/1999 | | |
| JP | 2001-053283 | 2/2001 | | |
| JP | 2005-049832 | 2/2005 | | |
| JP | 2005-057056 A | 3/2005 | | |
| JP | 2005-191546 | 7/2005 | | |
| JP | 2007-241237 A | 9/2007 | | |
| JP | 2009-135436 A | 6/2009 | | |
| JP | 2009-158947 A | 7/2009 | | |
| JP | 2009-212170 A | 9/2009 | | |
| JP | 2010-039228 A | 2/2010 | | |
| JP | 2010-147303 | * | 7/2010 | ........... H01L 29/786 |
| JP | 2012-528489 | 11/2012 | | |
| WO | WO-2010/065457 | 6/2010 | | |
| WO | WO-2010/065459 | 6/2010 | | |
| WO | WO-2010/065542 | 6/2010 | | |
| WO | WO-2010/138811 | 12/2010 | | |
| WO | WO-2012/138903 | 10/2012 | | |
| WO | WO-2013/082138 | 6/2013 | | |

* cited by examiner

SEMICONDUCTOR DEVICE

BACKGROUND OF THE INVENTION

1. Field of the Invention

The present invention relates to a semiconductor device including a thin film transistor (hereinafter referred to as TFT) using a microcrystalline silicon (hereinafter referred to as "μc-Si") layer. Note that in this specification, a semiconductor device refers to a semiconductor element itself or a device including a semiconductor element. As an example of such a semiconductor element, a transistor (a thin film transistor and the like) is given. In addition, a semiconductor device also includes a display device such as a liquid crystal display device in its category.

2. Description of the Related Art

FIG. 6A is a plan view showing a conventional TFT using μc-Si. FIG. 6B is a cross-sectional view along a line A-B shown in FIG. 6A. FIG. 6C is a cross-sectional view along a line C-D shown in FIG. 6A.

A gate electrode 202 is formed over a substrate 201 and a gate insulating film 203 is formed to cover the gate electrode 202. A μc-Si layer 204 serving as a semiconductor layer is formed over the gate insulating film 203 and an amorphous silicon (hereinafter referred to as "a-Si") layer 205 is formed over the μc-Si layer 204. An impurity silicon layer 206 is formed over the a-Si layer 205. Over the μc-Si layer 204, the stacked layer of the a-Si layer 205 and the impurity silicon layer 206 are separated into two. A source electrode 207a is formed over one of the stacked layers and a drain electrode 207b is formed over the other thereof.

The TFT shown in FIGS. 6A to 6C can operate at high speed because μc-Si having higher field-effect mobility than a-Si is used for the semiconductor layer. For this reason, when including the TFT shown in FIGS. 6A to 6C as a pixel TFT, a liquid crystal display panel can operate at high speed.

In the TFT shown in FIGS. 6A to 6C, when light leaking from the substrate 201 side enters the μc-Si layer 204, a leakage current is increased. Therefore, the TFT shown in FIGS. 6A to 6C is configured so as to block light entering the μc-Si layer 204 completely by covering the μc-Si layer 204 with the gate electrode 202. However, when the μc-Si layer 204 is covered with the gate electrode 202 in such a manner, the size of the gate electrode 202 is increased. Thus, increase in parasitic capacitance in overlapping portions 208 where the gate electrode 202 overlaps with each of the source electrode 207a and the drain electrode 207b impedes a high-speed operation of the transistor in some cases.

Further, recent liquid crystal displays have come to have higher resolution as well as higher operation speed. Such a high-resolution display panel including a large number of pixels is greatly affected by a load due to wiring resistance and parasitic capacitance between wirings and a load due to parasitic capacitance generated between a gate wiring and each of a source wiring and a drain wiring and between a gate electrode and each of a source electrode and a drain electrode. Therefore, it is difficult to achieve both high resolution and high-speed operation only by increasing the field-effect mobility of a pixel TFT.

In addition, the off-state leakage current of a pixel TFT of a liquid crystal display panel needs to be reduced. With a large off-state leakage current, charge accumulated in a storage capacitor of a pixel circuit is released, whereby an electric field applied to a liquid crystal is weakened; thus, a desired contrast cannot be obtained.

When a source electrode and a drain electrode are in contact with a μc-Si layer as shown in FIGS. 6A to 6C, a leakage current (off-state leakage current) may be generated between the source electrode and the drain electrode even when the TFT is in an off state. Furthermore, since μc-Si has a band gap of about 1.1 eV, which is small as compared to 1.4 eV to 1.8 eV, the band gap of a-Si, the off-state leakage current is increased when a high temperature is applied to a TFT using μc-Si or when the μc-Si of the TFT is irradiated with light.

REFERENCE

[Patent Document 1] Japanese Published Patent Application No. 2001-053283

SUMMARY OF THE INVENTION

An object of one embodiment of the present invention is to reduce an off-state leakage current between a source electrode and a drain electrode. Another object of one embodiment of the present invention is to reduce parasitic capacitance generated between a gate electrode and each of a source electrode and a drain electrode. Another object of one embodiment of the present invention is to reduce parasitic capacitance generated between a first wiring and a second wiring.

One embodiment of the present invention is a semiconductor device which includes a thin film transistor including a gate electrode, a gate insulating film formed to cover the gate electrode, a semiconductor layer formed over the gate insulating film and placed above the gate electrode, a first insulating film formed over a side surface of the semiconductor layer and the gate insulating film, a silicon layer formed over the first insulating film and electrically connected to the semiconductor layer, and a source electrode and a drain electrode which are formed over the silicon layer. The semiconductor layer is not in contact with each of the source electrode and the drain electrode.

According to the above embodiment of the present invention, the first insulating film and the silicon layer are provided between the semiconductor layer and the source and drain electrodes, so that the source electrode and the drain electrode are not in contact with the semiconductor layer. Thus, an off-state leakage current can be reduced between the source electrode and the drain electrode when the transistor is in an off state.

In the above embodiment of the present invention, the thin film transistor can include the first insulating film formed over the semiconductor layer, and in the thin film transistor, the source electrode and the drain electrode can be electrically separated from each other over the first insulating film.

Further, in the above embodiment of the present invention, the semiconductor device preferably includes a wiring portion including a first wiring and a second wiring intersecting with the first wiring. Between the first wiring and the second wiring, a first film including the same film as the gate insulating film, a first layer including the same layer as the semiconductor layer, a second film including the same film as the first insulating film, and a second layer including the same layer as the silicon layer are preferably formed. Thus, the distance between the first wiring and the second wiring can be long. Consequently, parasitic capacitance can be reduced in a portion where the wirings intersect with each other.

One embodiment of the present invention is a semiconductor device which includes a thin film transistor including a gate electrode; a gate insulating film formed to cover the gate electrode; a semiconductor layer formed over the gate insulating film and placed above the gate electrode; a second insulating film formed over the semiconductor layer; a first insulating film formed over a top surface and a side surface of the second insulating film, a side surface of the semiconductor layer, and the gate insulating film; a silicon layer formed over the first insulating film and electrically connected to the semiconductor layer; and a source electrode and a drain electrode which are formed over the silicon layer. The source electrode and the drain electrode are electrically separated from each other over the first insulating film. The semiconductor layer is not in contact with each of the source electrode and the drain electrode.

According to the above embodiment of the present invention, the first insulating film, the second insulating film, and the silicon layer are provided between the semiconductor layer and the source and drain electrodes, so that the source electrode and the drain electrode are not in contact with the semiconductor layer. Thus, an off-state leakage current can be reduced between the source electrode and the drain electrode even when the transistor is in an off state.

In the above embodiment of the present invention, the semiconductor device preferably includes a wiring portion including a first wiring and a second wiring intersecting with the first wiring. Between the first wiring and the second wiring, a first film including the same film as the gate insulating film, a first layer including the same layer as the semiconductor layer, a second film including the same film as the second insulating film, a third film including the same film as the first insulating film, and a second layer including the same layer as the silicon layer are preferably formed. Thus, the distance between the first wiring and the second wiring can be long. Consequently, parasitic capacitance can be reduced in a portion where the wirings intersect with each other.

Further, in the above embodiment of the present invention, the silicon layer, the first insulating film, and the gate insulating film are preferably formed between the source and drain electrodes and the gate electrode in the thin film transistor. Thus, parasitic capacitance generated in a portion where the gate electrode overlaps with each of the source electrode and the drain electrode can be reduced.

Further, in the above embodiment of the present invention, the semiconductor layer preferably includes a microcrystalline silicon layer, and the silicon layer preferably includes an amorphous silicon layer and an impurity silicon layer formed over the amorphous silicon layer. In the thin film transistor, the amorphous silicon layer is preferably in contact with a top surface of the microcrystalline silicon layer.

According to one embodiment of the present invention, an off-state leakage current between a source electrode and a drain electrode can be reduced. According to one embodiment of the present invention, parasitic capacitance generated between a gate electrode and each of a source electrode and a drain electrode can be reduced. According to one embodiment of the present invention, parasitic capacitance generated between a first wiring and a second can be reduced.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments.

Embodiment 1

Figure 1A:
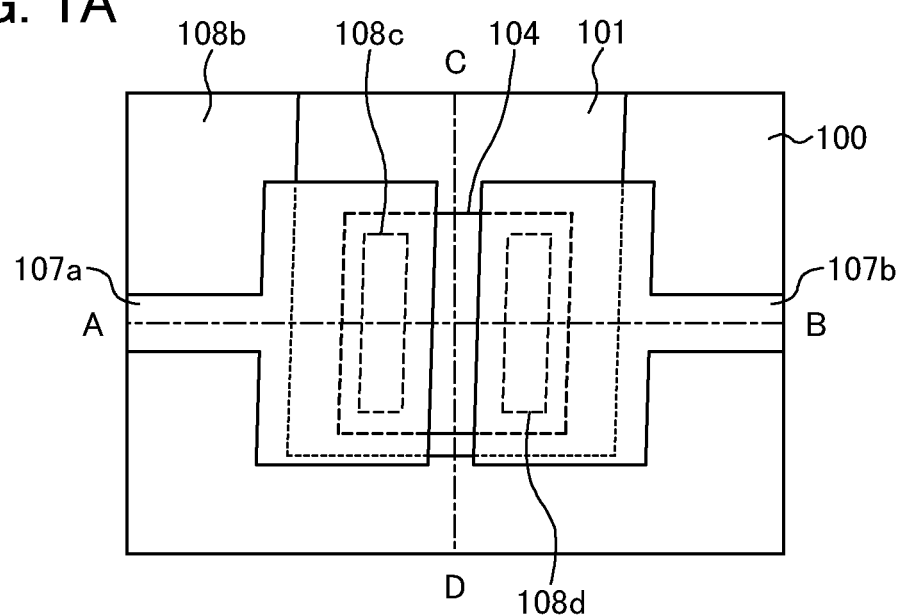
FIG. 1A is a plan view of a bottom-gate TFT according to one embodiment of the present invention.
Figure 1B:
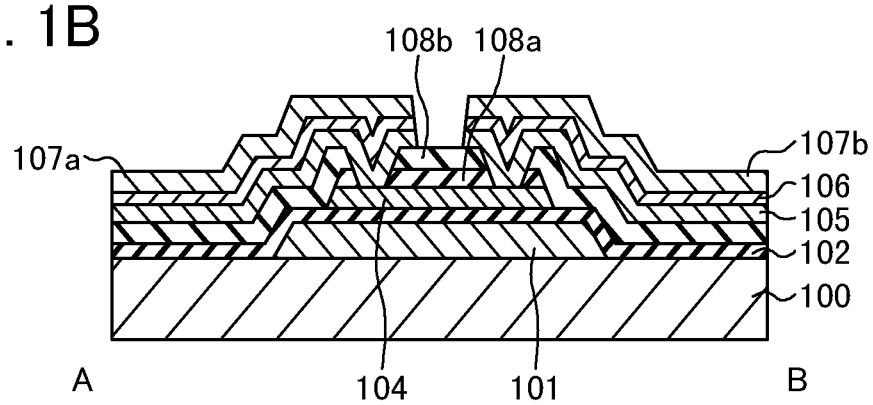
FIG. 1B is a cross-sectional view along a line A-B in FIG. 1A.
Figure 1C:
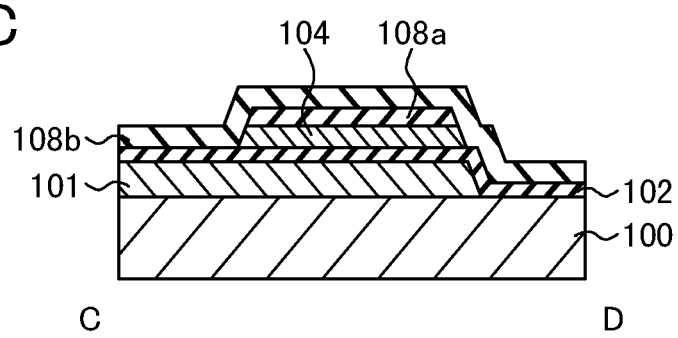
FIG. 1C is a cross-sectional view along a line C-D in FIG. 1A.

FIG. 1A is a plan view showing a bottom-gate TFT according to one embodiment of the present invention. FIG. 1B is a cross-sectional view along a line A-B shown in FIG. 1A. FIG. 1C is a cross-sectional view along a line C-D shown in FIG. 1A.

A gate electrode 101 is formed over a glass substrate 100. A gate insulating film 102 including a first gate insulating film and a second gate insulating film is formed over the gate electrode 101 and the glass substrate 100. The first gate insulating film is preferably formed using a SiNx film, for example. The second gate insulating film is preferably formed using a SiOx film, for example. Note that x is larger than 0.

A μc-Si layer 104 serving as a semiconductor layer placed above the gate electrode 101 is formed over the gate insulating film 102. A second gate insulating film is placed below the μc-Si layer 104.

A passivation film (channel protective film) 108a is formed over the μc-Si layer 104. Thus, the cleanliness of a back channel portion of the μc-Si layer 104 is kept high, which enables the TFT to have favorable electric characteristics. The formation of the passivation film 108a and the formation of the μc-Si layer 104 are preferably performed successively without breaking a vacuum. In addition, the passivation film 108a is preferably formed using any of a SiNx film, a SiOx film, a SiNO film, and a SiON film or a stacked layer of any of these films. When a SiNx film is used to form the passivation film 108a, a SiOx film is preferably provided between the μc-Si layer 104 and the passivation film 108a, in which case the reliability of the TFT is increased.

A protective film 108b is formed over the passivation film 108a and the gate insulating film 102. The protective film 108b is a film for protecting the μc-Si layer 104 from damage due to etching for forming a source electrode 107a and a drain electrode 107b. The protective film 108b is preferably formed using a SiNx film.

A first opening 108c and a second opening 108d which are placed over the μc-Si layer 104 are formed in the protective film 108b and the passivation film 108a.

A-Si layers 105 serving as i-Si layers are formed in the first opening 108c and the second opening 108d and over the protective film 108b. The a-Si layers 105 are in contact with the μc-Si layer 104 in the first opening 108c and the second opening 108d. Here, "i-Si" refers to intrinsic silicon to which no dopant, e.g., phosphorus (P), boron (B), and arsenic (As), is added. Note that nitrogen (N) may be added.

Over the a-Si layers 105, n$^+$ Si layers 106 which are impurity silicon layers are formed. The n$^+$ Si layers 106 are formed using a-Si to which phosphorus is added, μc-Si to which phosphorus is added, or the like. Alternatively, a stack of a-Si to which phosphorus is added and μc-Si to which phosphorus is added can be used for the n$^+$ Si layers 106. In the case of forming a p-channel TFT as the TFT, instead of the n$^+$ Si layers 106, p$^+$Si layers are formed using μc-Si to which boron is added, a-Si to which boron is added, or the like.

The a-Si layers 105 are formed under a condition where the dilution ratio of hydrogen to a deposition gas is high. Thus, crystals grow (crystallization proceeds) in respective parts of the a-Si layers 105 in contact with the μc-Si layer 104 and crystals do not grow (crystallization does not proceed) in respective parts of the a-Si layers 105 in contact with the protective film 108b. Consequently, crystalline regions (not shown) with a thickness in the range of 10 nm to 50 nm are formed in the respective parts of the a-Si layers 105 in contact with the μc-Si layer 104.

The source electrode 107a and the drain electrode 107b are formed over the n$^+$Si layers 106. The a-Si layers 105 and the n$^+$Si layers 106 are formed below the source electrode 107a and the drain electrode 107b. Over the protective film 108b, the source electrode 107a, the n$^+$Si layer 106 thereunder, and a-Si layer 105 thereunder are electrically separated from the drain electrode 107b, the n$^+$Si layer 106 thereunder, and the a-Si layer 105 thereunder.

A passivation film (not shown) is formed over the source electrode 107a, the drain electrode 107b, and the protective film 108b. A planarization film (not shown) is formed over the passivation film.

According to the bottom-gate TFT shown in FIGS. 1A to 1C, the a-Si layers 105, the n$^+$Si layers 106, and the protective film 108b are provided between the μc-Si layer 104 and the source and drain electrodes 107a and 107b, so that the source electrode 107a and the drain electrode 107b are not in contact with the μc-Si layer 104. That is, there is no Schottky contact on side surfaces of the μc-Si layer 104. With this structure, a leakage current (off-state leakage current) between the source electrode and the drain electrode can be reduced even when the TFT is in an off state.

In addition, the gate insulating film 102, the protective film 108b, and the a-Si layers 105 are provided between the gate electrode 101 and the source and drain electrodes 107a and 107b, so that parasitic capacitance generated in a portion where the gate electrode 101 overlaps with each of the source electrode 107a and the drain electrode 107b can be reduced. Consequently, the transistor can operate at high speed.

Since the a-Si layers 105 and the n$^+$Si layers 106 are formed below the source electrode 107a and the drain electrode 107b, reflection of light at the source electrode 107a and the drain electrode 107b can be reduced, which is effective in reducing the reflected light entering the μc-Si layer 104.

Figure 4A:
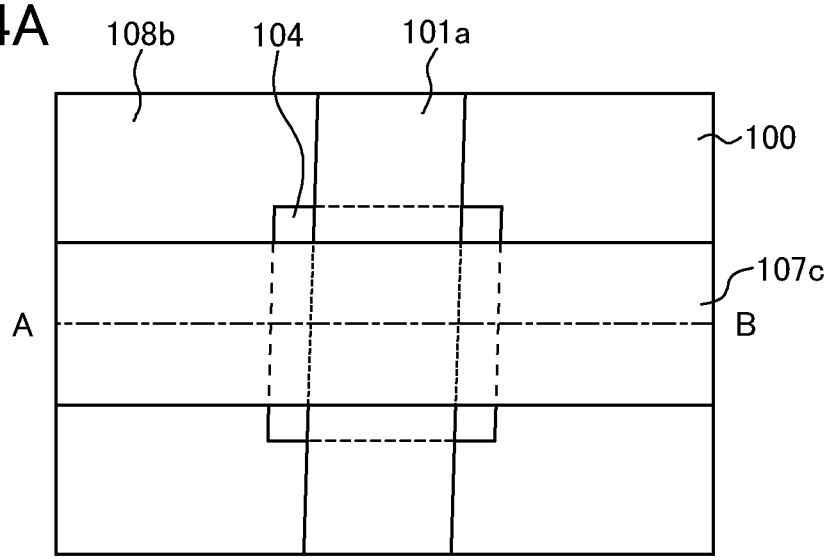
FIG. 4A is a plan view of a wiring portion formed over the same substrate as the TFT shown in FIGS. 1A to 1C.
Figure 4B:
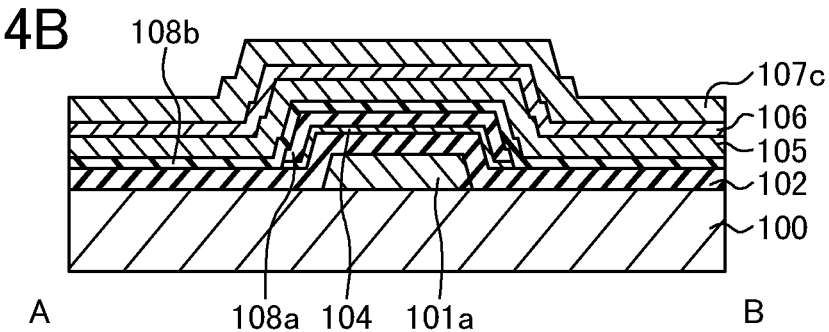
FIGS. 4B to 4D are cross-sectional views along a line A-B in FIG. 4A.

FIG. 4A is a plan view showing a wiring portion formed over the same substrate as the TFT shown in FIGS. 1A to 1C. FIG. 4B is a cross-sectional view along a line A-B shown in FIG. 4A.

A wiring 101a such as a gate line or a common wiring is formed over the glass substrate 100. An insulating film 102 which is formed in the same step and using the same film as the gate insulating film 102 is formed over the wiring 101a and the glass substrate 100. A layer 104 which is formed in the same step and using the same layer as the μc-Si layer 104 and placed above the wiring 101a is formed over the insulating film 102. An insulating film 108a which is formed in the same step and using the same film as the passivation film 108a is formed over the layer 104. An insulating film 108b which is formed in the same step and using the same film as the protective film 108b is formed over the insulating film 108a, the layer 104, and the insulating film 102. A layer 105 which is formed in the same step and using the same layer as the a-Si layers 105 is formed over the insulating film 108b. A layer 106 which is formed in the same step and using the same layer as the n$^+$Si layers 106 is formed over the layer 105. A source line 107c which is formed in the same step and using the same layer as the source electrode 107a is formed over the layer 106. The source line 107c intersects with the wiring 101a.

In other words, the insulating film 102, the layer 104, the insulating film 108a, the insulating film 108b, the layer 105, and the layer 106 are provided between the wiring 101a and the source line 107c. Thus, the distance between the wiring 101a and the source line 107c can be long. Consequently, parasitic capacitance can be reduced in a portion where the wirings intersect with each other. For example, parasitic capacitance can be reduced in a portion where a scan line (or a Cs line) and a video line intersect with each other.

Embodiment 2

Figure 2A:
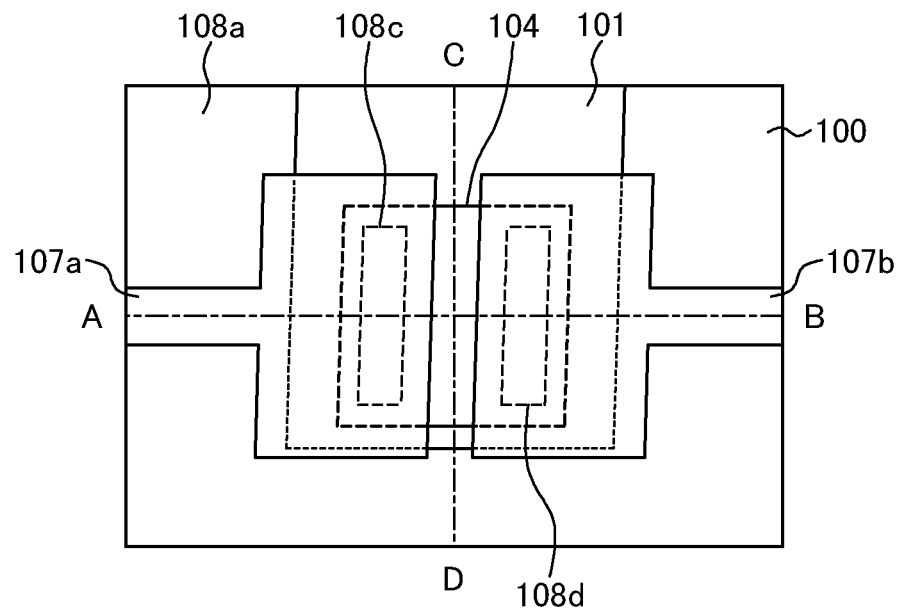
FIG. 2A is a plan view of a bottom-gate TFT according to one embodiment of the present invention.
Figure 2B:
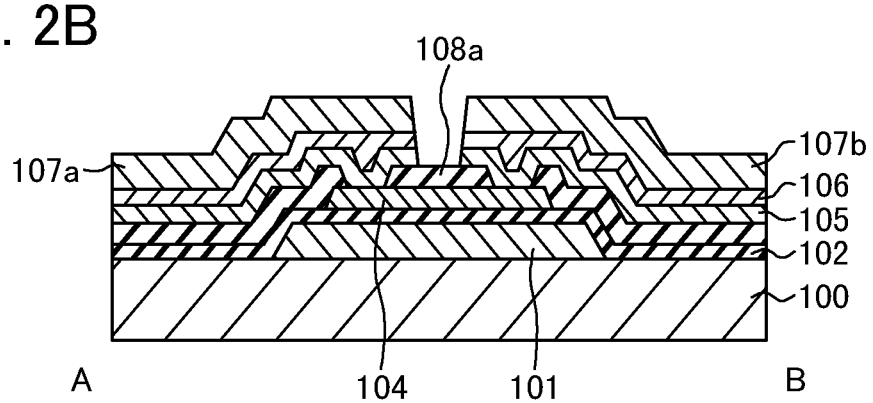
FIG. 2B is a cross-sectional view along a line A-B in FIG. 2A.
Figure 2C:
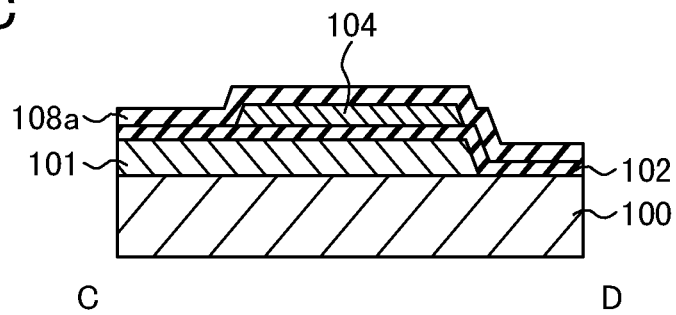
FIG. 2C is a cross-sectional view along a line C-D in FIG. 2A.

FIG. 2A is a plan view showing a bottom-gate TFT according to one embodiment of the present invention. FIG. 2B is a cross-sectional view along a line A-B shown in FIG. 2A. FIG. 2C is a cross-sectional view along a line C-D shown in FIG. 2A.

The TFT shown in FIGS. 2A to 2C is different from the TFT shown in FIGS. 1A to 1C in that instead of a protective film, a passivation film is used to reduce parasitic capacitance generated between the gate electrode 101 and each of the source electrode 107a and the drain electrode 107b. In other words, in FIGS. 2A to 2C, a film for reducing parasitic capacitance is formed using the same film and the same material as the passivation film, which is a point different from FIGS. 1A to 1C. The different point will be described below in detail.

The passivation film 108a is formed over the μc-Si layer 104 and the gate insulating film 102. The passivation film 108a is a film for protecting the μc-Si layer 104 from damage due to etching for forming the source electrode 107a and the drain electrode 107b.

The μc-Si layer 104 is formed, once exposed to the air, and processed into a semiconductor layer and then, the passivation film 108a is formed. For this reason, in order to increase the cleanliness of a back channel portion of the μc-Si layer 104, hydrogen plasma treatment, cycle cleaning, or the like is preferably performed on the μc-Si layer 104 as pretreatment for the formation of the passivation film 108a. Note that the passivation film 108a is preferably formed using a SiNx film.

The first opening 108c and the second opening 108d which are placed over the μc-Si layer 104 are formed in the passivation film 108a. The a-Si layers 105 serving as i-Si layers are formed in the first opening 108c and the second opening 108d and over the passivation film 108a. The a-Si layers 105 are in contact with the μc-Si layer 104 in the first opening 108c and the second opening 108d.

According to the bottom-gate TFT shown in FIGS. 2A to 2C, the a-Si layers 105, the n$^+$Si layers 106, and the passivation film 108a are provided between the μc-Si layer 104 and the source and drain electrodes 107a and 107b, so that the source electrode 107a and the drain electrode 107b are not in contact with the μc-Si layer 104. With this structure, a leakage current (off-state leakage current) between the source electrode and the drain electrode can be reduced even when the TFT is in an off state.

In addition, the gate insulating film 102, the passivation film 108a, and the a-Si layers 105 are provided between the gate electrode 101 and the source and drain electrodes 107a and 107b, so that parasitic capacitance generated in a portion where the gate electrode 101 overlaps with each of the source electrode 107a and the drain electrode 107b can be reduced.

Figure 4C:
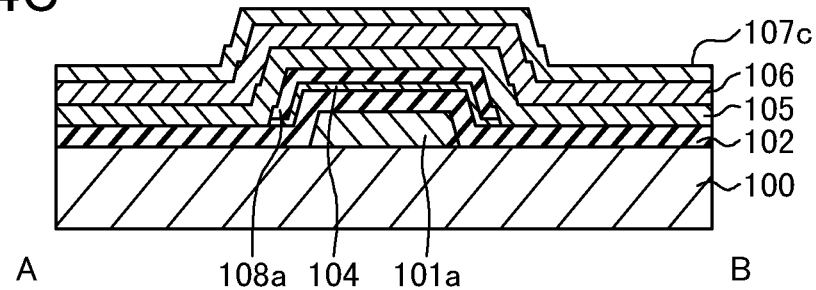

FIG. 4C shows a wiring portion formed over the same substrate as the TFT shown in FIGS. 2A to 2C and is a cross-sectional view of a portion corresponding to a portion shown in FIG. 4B.

The wiring portion shown in FIG. 4C is different from the wiring portion shown in FIG. 4B in that the protective film 108b is not provided.

According to the wiring portion shown in FIG. 4C, the insulating film 102, the layer 104, the insulating film 108a, the layer 105, and the layer 106 are provided between the wiring 101a and the source line 107c; thus, the distance between the wiring 101a and the source line 107c can be long. Consequently, parasitic capacitance can be reduced in a portion where the wirings intersect with each other.

Embodiment 3

Figure 3A:
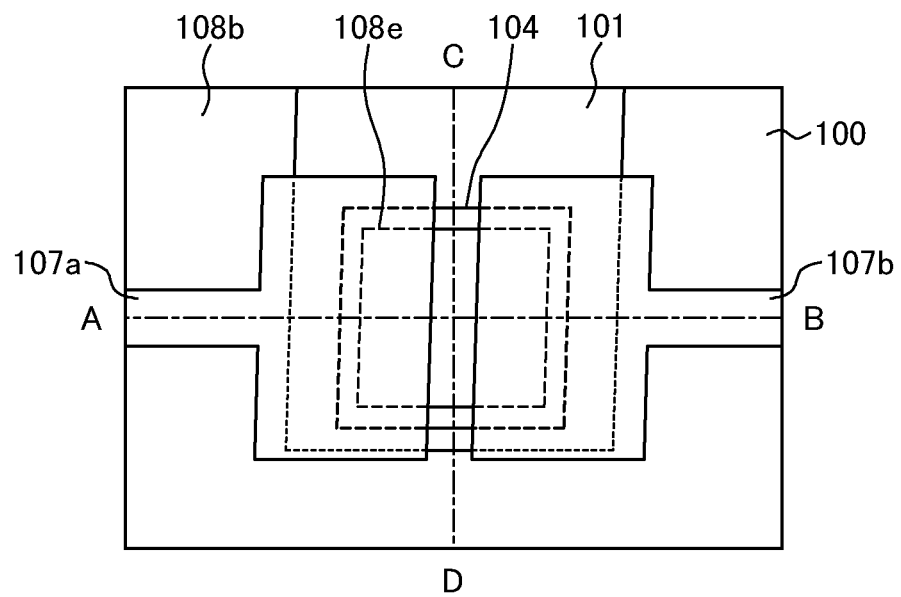
FIG. 3A is a plan view of a bottom-gate TFT according to one embodiment of the present invention.
Figure 3B:
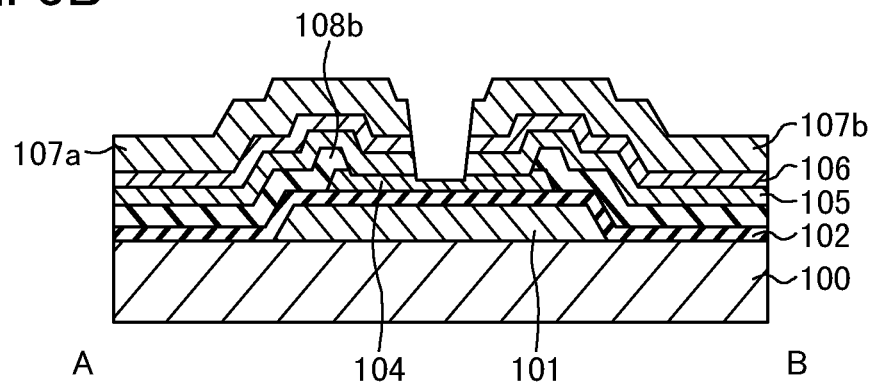
FIG. 3B is a cross-sectional view along a line A-B in FIG. 3A.
Figure 3C:
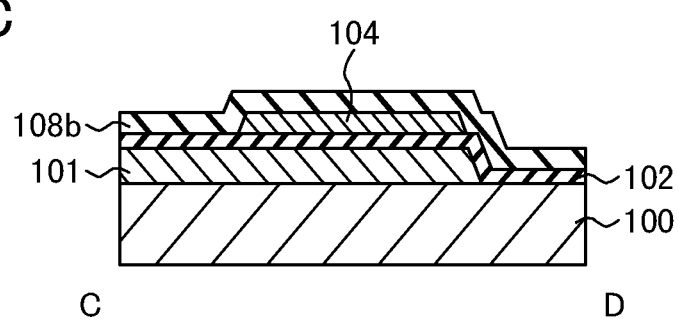
FIG. 3C is a cross-sectional view along a line C-D in FIG. 3A.

FIG. 3A is a plan view showing a bottom-gate TFT according to one embodiment of the present invention. FIG. 3B is a cross-sectional view along a line A-B shown in FIG. 3A. FIG. 3C is a cross-sectional view along a line C-D shown in FIG. 3A.

The TFT shown in FIGS. 3A to 3C has a structure in which a passivation film is not provided, which is a point different from the TFT shown in FIGS. 1A to 1C. The different point will be described below in detail.

The protective film 108b is formed over the μc-Si layer 104 and the gate insulating film 102. An opening 108e placed over the μc-Si layer 104 is formed in the protective film 108b. Note that the protective film 108b is preferably formed using a SiNx film.

The a-Si layers 105 serving as i-Si layers are formed in the opening 108e and over the protective film 108b. The a-Si layers 105 are in contact with the μc-Si layer 104 in the opening 108e.

At the time of etching the n$^+$Si layer 106 and the a-Si layer 105 together with a conductive film to be a source electrode and a drain electrode, a depression (countersunk portion that is slightly etched at the time of forming a source and a drain) is formed in the μc-Si layer 104 owing to over etching.

According to the bottom-gate TFT shown in FIGS. 3A to 3C, the a-Si layers 105, the n$^+$Si layers 106, and the protective film 108b are provided between the μc-Si layer 104 and the source and drain electrodes 107a and 107b, so that the source electrode 107a and the drain electrode 107b are not in contact with the μc-Si layer 104. With this structure, a leakage current (off-state leakage current) between the source electrode and the drain electrode can be reduced even when the TFT is in an off state.

In addition, the gate insulating film 102, the protective film 108b, and the a-Si layers 105 are provided between the gate electrode 101 and the source and drain electrodes 107a and 107b, so that parasitic capacitance generated in a portion where the gate electrode 101 overlaps with each of the source electrode 107a and the drain electrode 107b can be reduced.

Figure 4D:
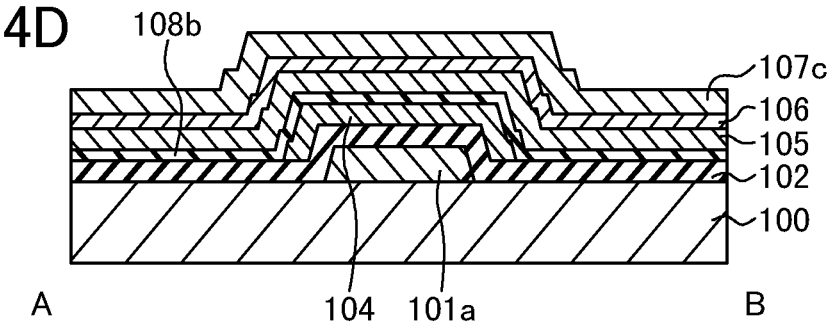

FIG. 4D shows a wiring portion formed over the same substrate as the TFT shown in FIGS. 3A to 3C and is a cross-sectional view of a portion corresponding to a portion shown in FIG. 4B.

The wiring portion shown in FIG. 4D is different from the wiring portion shown in FIG. 4B in that the passivation film 108a is not provided.

According to the wiring portion shown in FIG. 4D, the insulating film 102, the layer 104, the insulating film 108b, the layer 105, and the layer 106 are provided between the wiring 101a and the source line 107c; thus, the distance between the wiring 101a and the source line 107c can be long. Consequently, parasitic capacitance can be reduced in a portion where the wirings intersect with each other.

Embodiment 4

In this embodiment, a method for manufacturing a bottom-gate TFT according to one embodiment of the present invention will be described with reference to FIGS. 5A to 5E.

Figure 5A:
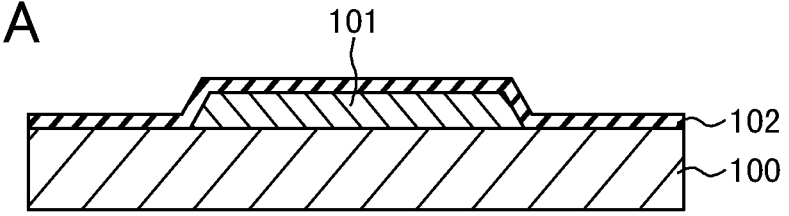
FIGS. 5A to 5E are cross-sectional views each showing a method for manufacturing a bottom-gate TFT according to one embodiment of the present invention.

As shown in FIG. 5A, the gate electrode 101 and a wiring such as a gate line or a common wiring (see FIG. 4B) are formed over the substrate 100. Specifically, a conductive film to be the gate electrode and the wiring is formed over the substrate 100 with the use of a sputtering apparatus. Ti, Al, Mo, W, Cu, Cr, Ni, TiN, or the like or a stacked-layer structure of any of these may be used as the conductive film. For example, the conductive film may be a stacked-layer structure in which Ti, Al, and Ti are stacked in this order. Then, the conductive film is patterned to form the gate electrode 101 and the gate line (not shown). In order to improve adhesion between the gate electrode 101 and the substrate 100, a nitride film of any of the above-described metal materials may be provided between the substrate 100 and the gate electrode 101. A transparent glass substrate, a ceramic substrate, or the like can be used as the substrate 100.

Side surfaces of the gate electrode 101 are preferably tapered. This is for the purpose of preventing a gate insulating film, a silicon film, and a wiring which are formed over the gate electrode 101 from being cut at a step portion of the gate electrode 101 in a later step. In order to taper the side surfaces of the gate electrode 101, etching may be performed while a resist mask is made to recede.

Next, the gate insulating film 102 covering the gate electrode 101 is formed with the use of a plasma CVD apparatus.

Figure 5B:
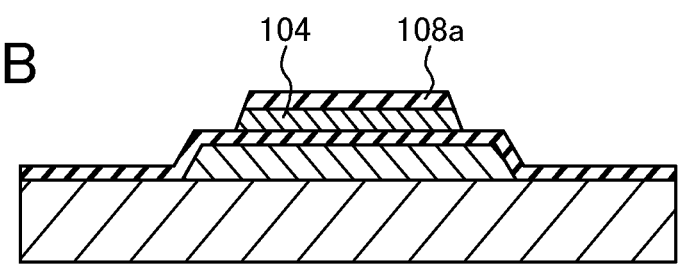

Next as shown in FIG. 5B, the gate insulating film 102 in which a first gate insulating film and a second gate insulating film (not shown) are stacked in this order is formed. The μc-Si layer 104 serving as a semiconductor layer is formed over the gate insulating film 102. The passivation film 108*a* is formed over the μc-Si layer 104. A SiNx film can be used as the first gate insulating film and a SiOx film can be used as the second gate insulating film. It is preferable that all the film formation be successively performed in a vacuum chamber of the plasma CVD apparatus because the μc-Si layer 104 is easily oxidized when exposed to the air. One vacuum chamber may be used or a plurality of vacuum chambers may be used.

The thickness of the SiOx film which is the second gate insulating film is preferably less than or equal to 50 nm, further preferably less than or equal to 10 nm. Plasma oxidation treatment is performed after the formation of the SiNx film which is the first gate insulating film, whereby the SiOx film with a thickness of less than or equal to 10 nm can be formed over the first gate insulating film. For the plasma oxidation treatment, plasma of an oxidizing gas containing O such as $N_2O$, $O_2$, or $H_2O$, plasma of a mixed gas of an oxidizing gas and $H_2$, or plasma of a mixed gas of an oxidizing gas and a rare gas such as helium, argon, neon, krypton, or xenon may be used.

The degree of crystallization and adhesion of the μc-Si layer 104 over the SiOx film can be higher than those of the μc-Si layer 104 over the SiNx film. The μc-Si layer 104 includes a first μc-Si layer and a second μc-Si layer formed over the first μc-Si layer.

A method for forming the first μc-Si layer and the second μc-Si layer will be described below in detail.

The first μc-Si layer includes mixed phase grains. It is preferable that the density of the mixed phase grains (existing percentage of the mixed phase grains in a plane) be low, the uniformity of grain sizes of the mixed phase grains be high, and the crystallinity of the mixed phase grains be high. Therefore, the first μc-Si layer may have space between the adjacent mixed phase grains without the adjacent mixed phase grains being in contact with each other. The thickness of the first μc-Si layer is preferably greater than or equal to 1 nm and less than or equal to 10 nm. In a region having the space between the adjacent mixed phase grains without the adjacent mixed phase grains being in contact with each other, the smallest height of the mixed phase grains which are not in contact with each other is preferably 1 nm or more and the largest height of the mixed phase grains which are not in contact with each other is preferably 10 nm or less. Note that the mixed phase grains each include an amorphous silicon region and a plurality of silicon crystallites that are microcrystals regarded as single crystals of silicon. In some cases, the mixed phase grains may include a twin crystal.

The first μc-Si layer is formed in a treatment chamber of a plasma CVD apparatus, using plasma generated by glow discharge with the use of a mixture of a deposition gas containing silicon and hydrogen as a source gas, under a first condition which allows mixed phase grains serving as nuclei to be formed in the state that the density of mixed phase grains is low and the crystallinity of the mixed phase grains is high. Alternatively, the first μc-Si layer is formed by glow discharge plasma with a mixture of a deposition gas containing silicon, hydrogen, and a rare gas such as helium, neon, or krypton. Here, μc-Si is formed under the first condition in which the pressure inside the treatment chamber is higher than or equal to 67 Pa and lower than or equal to 50000 Pa (higher than or equal to 0.5 Torr and lower than or equal to 375 Torr).

The method for supplying the source gas under the first condition is such a method that a gas obtained by diluting the deposition gas containing silicon by setting the flow rate of hydrogen to be greater than or equal to 50 times and less than or equal to 1000 times that of the deposition gas is supplied. The deposition temperature is preferably from room temperature to 300° C., and further preferably 150° C. to 280° C. The distance between an upper electrode and a lower electrode of the plasma CVD apparatus may be set to a distance which allows generation of plasma.

Typical examples of the deposition gas containing silicon include $SiH_4$, $Si_2H_6$, and the like.

In the case where a rare gas such as helium, argon, neon, krypton, or xenon is mixed into the source gas of the first μc-Si layer, the deposition rate of the first μc-Si layer is increased. In addition, in the case where the deposition rate is increased, the amount of impurities mixed in the first μc-Si layer is reduced, so that the crystallinity of the first μc-Si layer can be improved. Thus, the on-state current and field-effect mobility of the thin film transistor are increased and throughput of the thin film transistor can also be increased.

In the glow discharge at the time of forming the first μc-Si layer, the plasma is generated by application of high-frequency power with a frequency of 3 MHz to 30 MHz, typically 13.56 MHz or 27.12 MHz in the HF band, or high-frequency power with a frequency of approximately 30 MHz to 300 MHz in the VHF band, typically 60 MHz. It is preferable to determine the power for generating the plasma as appropriate in accordance with the ratio of the flow rate of hydrogen to the flow rate of the deposition gas containing silicon.

Next, the second μc-Si layer is formed over the first μc-Si layer. The second μc-Si layer includes mixed phase grains each including silicon crystallites and amorphous silicon, and is preferably formed under a condition which enables the second μc-Si layer to fill the space between the mixed phase grains of the first μc-Si layer and also promotes crystal growth. Note that the thickness of the second μc-Si layer is preferably greater than or equal to 30 nm and less than or equal to 100 nm.

The second μc-Si layer is formed in a treatment chamber of the plasma CVD apparatus, using plasma generated by glow discharge with the use of a mixture of a deposition gas containing silicon and hydrogen as a source gas under a second condition. Alternatively, the second μc-Si layer may be formed using plasma generated by glow discharge with the use of a mixture of a deposition gas containing silicon, hydrogen, and a rare gas such as helium, neon, or krypton under the second condition. Here, the μc-Si is formed under the second condition in which the deposition gas containing silicon is diluted by setting the flow rate of hydrogen to be greater than or equal to 100 times and less than or equal to 2000 times that of the deposition gas and the pressure inside the treatment chamber is set to be higher than or equal to 1333 Pa and lower than or equal to 50000 Pa (higher than or equal to 10 Torr and lower than or equal to 375 Torr). As a result, the ratio of a crystalline region to an amorphous semiconductor region is increased in the second μc-Si layer, whereby the crystallinity is increased. The deposition temperature at this time is preferably from room temperature to 300° C., and further preferably 150° C. to 280° C. The distance between an upper electrode and a lower electrode of the plasma CVD apparatus may be set to a distance which allows generation of plasma. By newly generating the mixed phase grains of the second μc-Si layer in the space between the mixed phase grains of the first μc-Si layer, the size of the mixed phase grains is reduced. Therefore, it is preferable that the frequency of generation of the mixed phase grains of the second μc-Si layer be lower than that of the mixed phase grains of the first μc-Si layer.

In the case where a rare gas such as helium, argon, neon, krypton, or xenon is mixed into the source gas of the second μc-Si layer, the crystallinity of the second μc-Si layer can be increased in a manner similar to that of the first μc-Si layer. Thus, the on-state current and the field-effect mobility of the thin film transistor are increased and the throughput of the thin film transistor can also be increased.

The condition for generating plasma by glow discharge at the time of forming the first μc-Si layer can be employed as appropriate for formation of the second μc-Si layer. When plasma is generated by glow discharge under the same condition in forming the first μc-Si layer and the second μc-Si layer, throughput can be increased; however, different conditions may be employed.

The first μc-Si layer and the second μc-Si layer are formed using μc-Si. Here, the μc-Si belongs to a metastable state of an intermediate between amorphous and a single crystal when Gibbs free energy is considered. That is, the microcrystalline semiconductor is a semiconductor having a third state which is stable in terms of free energy, has short-range order to medium-range order, and includes a crystal grain boundary, a twin crystal boundary, dislocation, defects, and lattice distortion. Columnar-like or needle-like crystals grow in a normal direction to a surface of a base layer.

The Raman spectrum of μc-Si, which is a typical example, shifts to a lower wavenumber side than 520 cm$^{-1}$ which represents single crystal silicon. That is, the peak of the Raman spectrum of the μc-Si exists between 520 cm$^{-1}$ which represents single crystal silicon and 480 cm$^{-1}$ which represents amorphous silicon. The μc-Si includes at least 1 at. % or more of hydrogen or halogen to terminate a dangling bond. Further promotion of lattice distortion by inclusion of a rare gas element such as helium, argon, krypton, or neon can provide a favorable μc-Si with increased stability. Such μc-Si is disclosed in U.S. Pat. No. 4,409,134, for example.

According to this embodiment, a μc-Si layer having high crystallinity with reduced space between mixed phase grains can be formed.

Further, with a two-step film formation method in which the second μc-Si layer is stacked over the first μc-Si layer, the space between the mixed phase grains can be effectively filled; consequently, a μc-Si layer having large grain size and high crystallinity as well as keeping high film density can be formed. As a result, the field-effect mobility can be increased, and a device with more excellent electric characteristics can be provided.

In this embodiment, the two-step film formation method in which the second μc-Si layer is stacked over the first μc-Si layer is employed to form the μc-Si layer; however, the two-step film formation method is not a requisite and the μc-Si layer may be formed using a one-step film formation method or a three-step film formation method.

Alternatively, a cycle flow process can be employed for at least one of the method for supplying the source gas under the first condition and the method for supplying the source gas under the second condition in this embodiment. A case of employing a cycle flow process for the method for supplying the source gas under the first condition will be described below. The following description can also apply to a case of employing a cycle flow process for the method for supplying the source gas under the second condition.

The method for supplying the source gas under the first condition is as follows: supply of a gas obtained by diluting the deposition gas containing silicon by setting the flow rate of hydrogen to be greater than or equal to 50 times and less than or equal to 1000 times that of the deposition gas and supply of a gas in which the flow rate of the deposition gas is lower than that of the deposition gas in the gas supplied as above and is set so as to primarily cause etching of silicon deposited over the second gate insulating film than deposition of silicon over the second gate insulating film are alternately performed. Note that the flow rate of the deposition gas which primarily causes the etching may be 0 sccm. The deposition temperature at this time is preferably room temperature to 300° C., further preferably 150° C. to 280° C. The distance between an upper electrode and a lower electrode of the plasma CVD apparatus may be set to a distance which allows generation of plasma.

The method for supplying the source gas under the first condition is a method in which the flow rate of the deposition gas containing silicon is changed to alternate between high and low flow rates during generation of plasma by glow discharge. During the period in which the deposition gas is supplied at a low flow rate, etching of silicon deposited over the second gate insulating film primarily occurs rather than deposition of silicon over the second gate insulating film. In contrast, during the period in which the deposition gas is supplied at a high flow rate, deposition of silicon over the second gate insulating film primarily occurs rather than etching of silicon deposited over the second gate insulating film. Thus, an amorphous silicon component is selectively etched by the hydrogen gas during the period in which the deposition gas is supplied at a low flow rate, and the mixed phase grains grow during the period in which the deposition gas is supplied at a high flow rate. By the repetition of the etching and the growth, the first μc-Si layer including a small amount of amorphous silicon component and having high crystallinity can be obtained.

The supply of the deposition gas at a high flow rate enlarges the mixed phase grains that have already been deposited over the second gate insulating film and produces new mixed phase grains over the second gate insulating film. The supply of the deposition gas at a low flow rate causes etching and removal of the small mixed phase grains that have just been generated but leaves the relatively large mixed phase grains that have already been deposited over the second gate insulating film. By the repetition of the growth and the etching, the mixed phase grains with small grain sizes are reduced. Thus, the first μc-Si layer including many mixed phase grains having large and highly uniform grain sizes can be obtained.

With the first condition in this manner, crystal growth is promoted and the crystallinity of the mixed phase grains is increased. That is, the size of a crystallite included in the mixed phase grain is increased. Further, space is formed between the adjacent mixed phase grains, so that the density of the mixed phase grains is lowered.

The use of the above-described method for supplying the source gas in which the flow rate of the deposition gas is changed to alternate between high and low flow rates makes the grain size of the mixed phase grains deposited over the second gate insulating film large, the uniformity of the mixed phase grains high, and the crystallinity of the mixed phase grains high as compared to the case of supplying the deposition gas at a constant flow rate without the flow rate thereof changed.

As described above, at the time of forming the first μc-Si layer, the use of the supplying method of the source gas in which the flow rate of the deposition gas is changed to alternate between high and low flow rates makes the grain size of the mixed phase grains deposited over the second gate insulating film large and the crystallinity of the mixed phase grains high as compared to the case of supplying the deposition gas at a constant flow rate without the flow rate thereof changed. Further, with the two-step film formation method in which the second μc-Si layer is stacked over the first μc-Si layer, space between the mixed phase grains can be effectively filled; consequently, a μc-Si layer having large grain size and high crystallinity as well as keeping high film density can be formed. As a result, the field-effect mobility can be increased, and a device with more excellent electric characteristics can be provided.

For the passivation film 108a, SiNx or a stacked film in which SiOx and SiNx are stacked in this order may be used, for example. The thin film of SiOx in the stacked film may be formed by plasma oxidation treatment after the formation of the μc-Si layer. Thus, adhesion of SiNx to the μc-Si layer is increased.

Next, a first resist mask (not shown) is formed by a photolithography step. With the use of the first resist mask, the passivation film 108a and the μc-Si layer 104 are etched. Thus, the μc-Si layer 104 serving as a semiconductor layer placed above the gate electrode 101 and the passivation film 108a are formed over the gate insulating film 102 (see FIG. 5B). The shape of a top surface of the passivation film 108a is similar to that of the μc-Si layer 104.

Figure 5C:
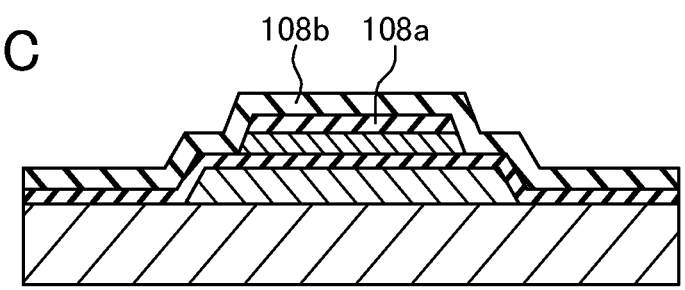

Next, as shown in FIG. 5C, the protective film 108b is formed over the passivation film 108a and the gate insulating film 102.

Figure 5D:
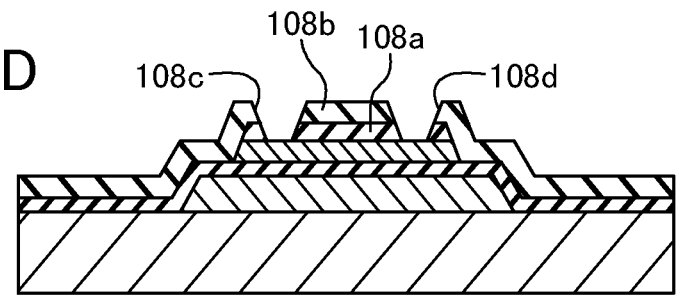

Next, a second resist mask (not shown) is formed by a photolithography step. With the use of the second resist mask, the protective film 108b and the passivation film 108a are etched; thus, the first opening 108c and the second opening 108d which are placed over the μc-Si layer 104 are formed in the protective film 108b and the passivation film 108a as shown in FIG. 5D.

Figure 5E:
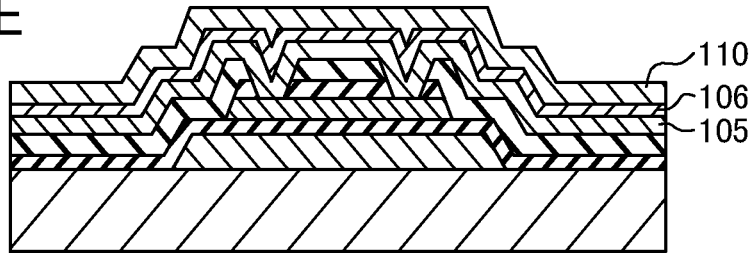
Figure 6A:
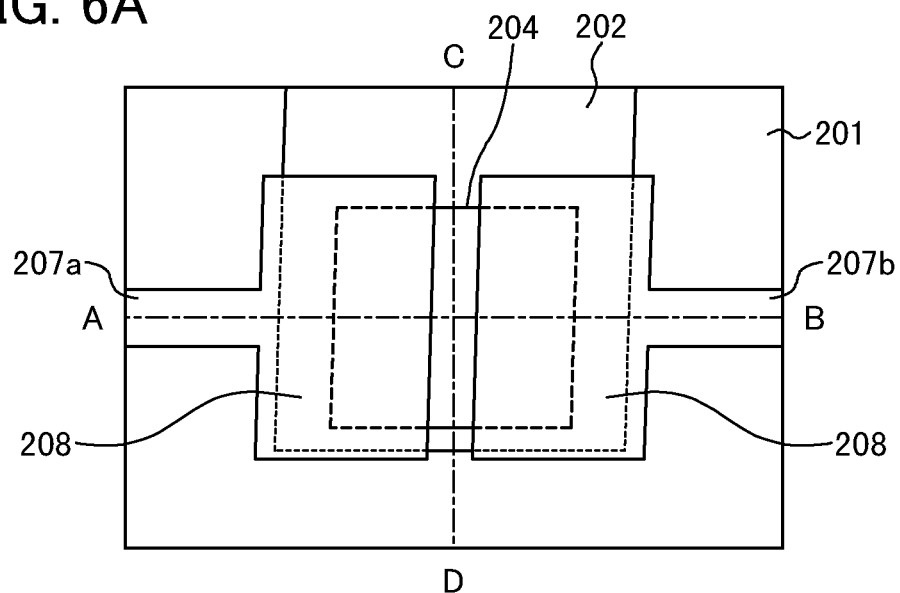
FIG. 6A is a plan view of a conventional TFT using μc-Si.
Figure 6B:
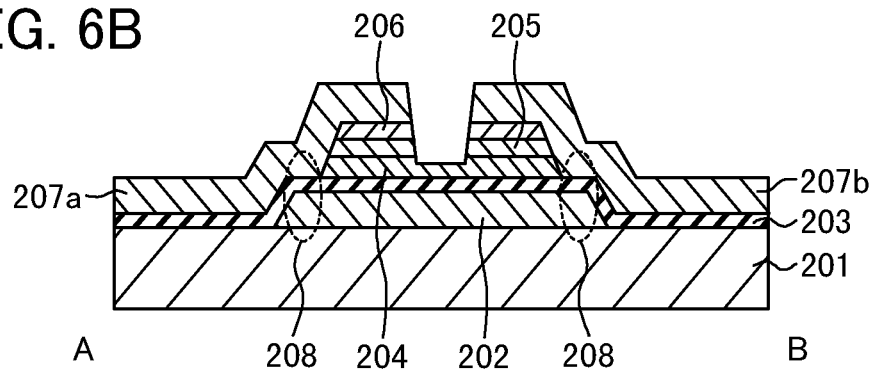
FIG. 6B is a cross-sectional view along a line A-B in FIG. 6A.
Figure 6C:
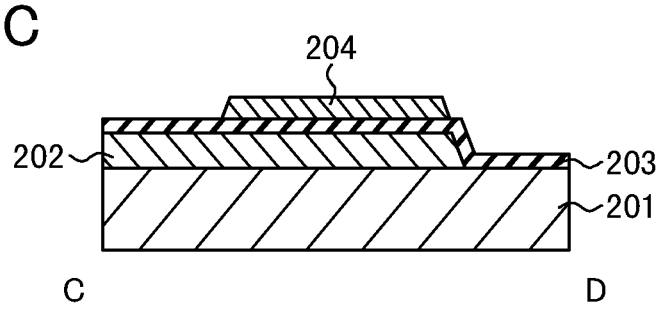
FIG. 6C is a cross-sectional view along a line C-D in FIG. 6A.

Then, as shown in FIG. 5E, the a-Si layer 105 serving as an i-Si layer and the n$^+$Si layer 106 are formed in the first opening 108c and the second opening 108d and over the protective film 108b with the use of the plasma CVD apparatus. The a-Si layer 105 is formed as a buffer layer for reducing an off-state leakage current. The a-Si layer 105 is formed because an amorphous phase having a wide band gap is necessary in order to reduce an off-state leakage current.

The a-Si layer 105 and the n$^+$Si layer 106 are formed in a treatment chamber of the plasma CVD apparatus, using plasma generated by glow discharge with the use of a mixture of a deposition gas containing silicon and a gas containing hydrogen.

A condition where a large amount of $H_2$ is used in a film formation gas, i.e., a high hydrogen dilution condition is preferably used in order to obtain a favorable contact at the interface between the μc-Si layer 104 and the a-Si layer 105. Specifically, in a typical example of a condition for forming the a-Si layer 105, the flow rate of hydrogen is preferably about 10 times to 100 times that of the deposition gas containing silicon. For example, $SiH_4:H_2$ is preferably about 1:10 to 1:100. Note that in a typical example of a condition for forming a normal amorphous silicon film, the flow rate of hydrogen is 0 times to 5 times that of the deposition gas containing silicon.

Although an appropriate dilution ratio of hydrogen varies depending on a pressure, radio frequency (RF) power, temperature, or the like, the dilution ratio of hydrogen may be adjusted so that crystals grow in a region of the a-Si layer 105, which has a thickness of about 10 nm to 50 nm (preferably 20 nm to 40 nm) and is placed over the μc-Si layer 104 serving as a semiconductor layer, and a region of the a-Si layer 105 other than the above region is amorphous. Thus, a region where crystals grow can be formed at the interface between the μc-Si layer 104 and the a-Si layer 105, and the a-Si layer 105 formed using a well-ordered silicon film having fewer defects and a steep tail of a level at a valence band edge can be formed.

The region where crystals grow has depressions and projections. The projection has a conical or pyramidal shape with a width decreasing from the μc-Si layer 104 side toward the n$^+$Si layer 106 side (a tip of the projection has an acute angle). Alternatively, the region where crystals grow may have a projecting (inverted conical or pyramidal) shape with a width increasing from the μc-Si layer 104 side toward the n$^+$Si layer 106 side.

Further, when crystals grow in the a-Si layer 105 over the protective film 108b, crystals grow in a region where the gate electrode 101 is not provided below the μc-Si layer 104; therefore, a large amount of off-state current leaks when light (light from a backlight for a liquid crystal display) is emitted from the substrate side. For this reason, the a-Si layer 105 may be formed with the use of a film formation gas in which a small amount of $NH_3$ is added in order to reduce excessive crystal growth of the a-Si layer 105 that is a buffer layer.

The n$^+$Si layer 106 is formed in a treatment chamber of the plasma CVD apparatus, using plasma generated by glow discharge with the use of a mixture of a deposition gas containing silicon, hydrogen, and phosphine (diluted with hydrogen or silane) as a source gas. Amorphous silicon to which phosphorus is added or microcrystalline silicon to which phosphorus is added is formed by diluting the deposition gas including silicon with hydrogen.

Next, a conductive film 110 to be a source electrode, a drain electrode, and a source line is formed with a sputtering apparatus, a CVD apparatus, or a vacuum evaporation apparatus. It is sufficient that the conductive film 110 has a structure similar to that of the conductive film to be the gate electrode 101.

Next, a resist mask (not shown) is formed by a photolithography step and the conductive film 110 is etched with the use of the resist mask. Thus, as show in FIG. 1B, the source electrode 107a, the drain electrode 107b, and the source line are formed. The source line intersects with a wiring (a gate line or a common wiring) (see FIG. 4B). The etching of the conductive film may be either dry etching or wet etching. At the time of etching the conductive film, the n$^+$Si layer 106 and the a-Si layer 105 are etched together with the conductive film. The μc-Si layer 104 serving as a semiconductor layer is not etched because the μc-Si layer 104 is protected by the protective film 108b.

Then, a protective insulating film (a passivation film) (not shown) for covering the exposed protective film 108b, the exposed n$^+$Si layers 106, the exposed a-Si layers 105, the source electrode 107a, and the drain electrode 107b are formed.

This application is based on Japanese Patent Application Serial No. 2011-116172 filed with Japan Patent Office on May 24, 2011, the entire contents of which are hereby incorporated by reference.

What is claimed is:
1. A semiconductor device comprising:
a gate electrode;
a gate insulating film over the gate electrode;
a semiconductor layer over the gate insulating film;
a second insulating film over the semiconductor layer;
a first insulating film covering a top surface and a side surface of the second insulating film;

a silicon layer over the first insulating film and electrically connected to the semiconductor layer;

a source electrode and a drain electrode over the silicon layer; and a wiring portion including a first wiring and a second wiring intersecting with the first wiring, wherein a first film comprising a same film as the gate insulating film, a first layer comprising a same layer as the semiconductor layer, a second film comprising a same film as the second insulating film, a third film comprising a same film as the first insulating film, and a second layer comprising a same layer as the silicon layer are formed between the first wiring and the second wiring, wherein the first wiring and the second wiring are not in electrical contact with the first layer, wherein the semiconductor layer is not in contact with each of the source electrode and the drain electrode, and wherein the silicon layer includes a stack of an amorphous silicon layer, and a microcrystalline silicon layer over the amorphous silicon layer.

2. The semiconductor device according to claim 1, wherein the silicon layer, the first insulating film, and the gate insulating film are formed between the source and drain electrodes and the gate electrode.

3. The semiconductor device according to claim 1, wherein the semiconductor layer includes a microcrystalline silicon layer, and wherein the amorphous silicon layer is in contact with a top surface of the microcrystalline silicon layer.

4. The semiconductor device according to claim 1, wherein the first insulating film is in contact with a side surface of the semiconductor layer and a top surface of the gate insulating film.

5. The semiconductor device according to claim 1, wherein phosphorus or boron is added in the microcrystalline silicon layer.

* * * * *